United States Patent [19]
Biehler et al.

[11] Patent Number: 5,422,824
[45] Date of Patent: Jun. 6, 1995

[54] COMPUTERIZED DIAGNOSTIC SYSTEM FOR MICROPROCESSOR-BASED, PORTABLE MACHINERY

[75] Inventors: Devin D. Biehler, Mocksville; David R. Pritchard, Winston-Salem, both of N.C.

[73] Assignee: Ingersoll-Rand Company, Woodcliff Lake, N.J.

[21] Appl. No.: 74,245

[22] Filed: Jun. 9, 1993

[51] Int. Cl.$^6$ .............................................. F16M 3/00
[52] U.S. Cl. ...................... 364/494; 364/550; 324/555; 340/620; 340/626; 340/635; 340/670
[58] Field of Search .............. 364/550, 424.04, 551.02, 364/494; 324/555; 340/620, 626, 635, 670

[56] References Cited

U.S. PATENT DOCUMENTS

| | | | |
|---|---|---|---|
| 4,792,911 | 12/1988 | Gouzalez et al. | 364/551.02 |
| 5,005,142 | 4/1991 | Lipchak et al. | 364/550 |
| 5,122,976 | 6/1992 | Bellows et al. | 364/550 |
| 5,278,508 | 1/1994 | Bowman | 364/424.04 |

*Primary Examiner*—Ellis B. Ramirez
*Assistant Examiner*—Thomas Peeso
*Attorney, Agent, or Firm*—Victor M. Genco, Jr.

[57] ABSTRACT

A computerized diagnostic system includes a microprocessor-based electronic controller which controls a portable machine. Electronic sensors provide raw, operating parameters to a RAM type memory of the controller. A locator locates predetermined RAM addresses of raw machine operating parameters which are known to be useful in the monitoring and diagnosis of the portable machine. A remote, microprocessor-based computer diagnoses and monitors the electronically controlled machine. A display means displays the user friendly symbols in function-specific groupings which reveal patterns of machine operation, and which identifies the process which the machine is performing.

3 Claims, 2 Drawing Sheets

COMPUTERIZED DIAGNOSTIC SYSTEM FOR MICROPROCESSOR-BASED, PORTABLE MACHINERY

BACKGROUND OF THE INVENTION

This invention generally relates to electronic diagnostic systems, and more particularly to an electronic diagnostic system for microprocessor-based, electronically controlled portable machinery, such as a portable centrifugal compressor, for example.

Typically, diagnostic systems present data comprising machine operating characteristics in an unorganized manner which severely inhibits a technicians ability to diagnose and monitor a machine. Such systems often require the technician to navigate between a plurality of display screens to evaluate the performance of a predetermined machine sub-system. This, of course, is costly both in terms of machine downtime and in wasted manhours to repair, diagnose, and monitor the portable machine.

The foregoing illustrates limitations known to exist in present portable compressors. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by providing a computerized diagnostic system for a portable machine having unique operating characteristics. A microprocessor-based electronic controller controls the portable machine. The electronic controller has a RAM type memory and a ROM type memory. Electronic sensors sense raw, operating parameters of the portable machine. The raw operating parameters of the portable machine are collected and stored in the RAM of the electronic controller. A locator locates predetermined RAM addresses of raw machine operating parameters which are known to be useful in the monitoring and diagnosis of the unique portable machine. A remote, microprocessor-based computer diagnoses and monitors the electronically controlled machine. The remote computer is disposed in communication with the electronic controller. A reference means, stored in a memory of the remote computer means, permits interpretation of the raw, predetermined machine operating parameters known to be useful in the monitoring and diagnosis of the machine. A means for retrieving, into the memory of the remote computer means, the raw, predetermined machine operating parameters in a predetermined, time stamped order facilitates identification thereof. The remote computer interprets the retrieved, raw, predetermined machine operating parameters by comparing these parameters to the reference means. Thereafter, the remote computer means converts the raw, predetermined machine operating parameters into user friendly symbols. A display apparatus displays the user friendly symbols in function-specific groupings which reveal patterns of operational characteristics of the portable machine, and which identify the process which the portable machine is performing.

The foregoing and other aspects will become apparent from the following detailed description of the invention when considered in conjunction with the accompanying drawing figures.

BRIEF DESCRIPTION OF THE DRAWING FIGURES

FIG. 1 is a functional schematic of a compressed air system of a portable, diesel-driven centrifugal compressor; and FIG. 2 is a block diagram of an electronic diagnostic system according to the present invention.

DETAILED DESCRIPTION

Figure 1:
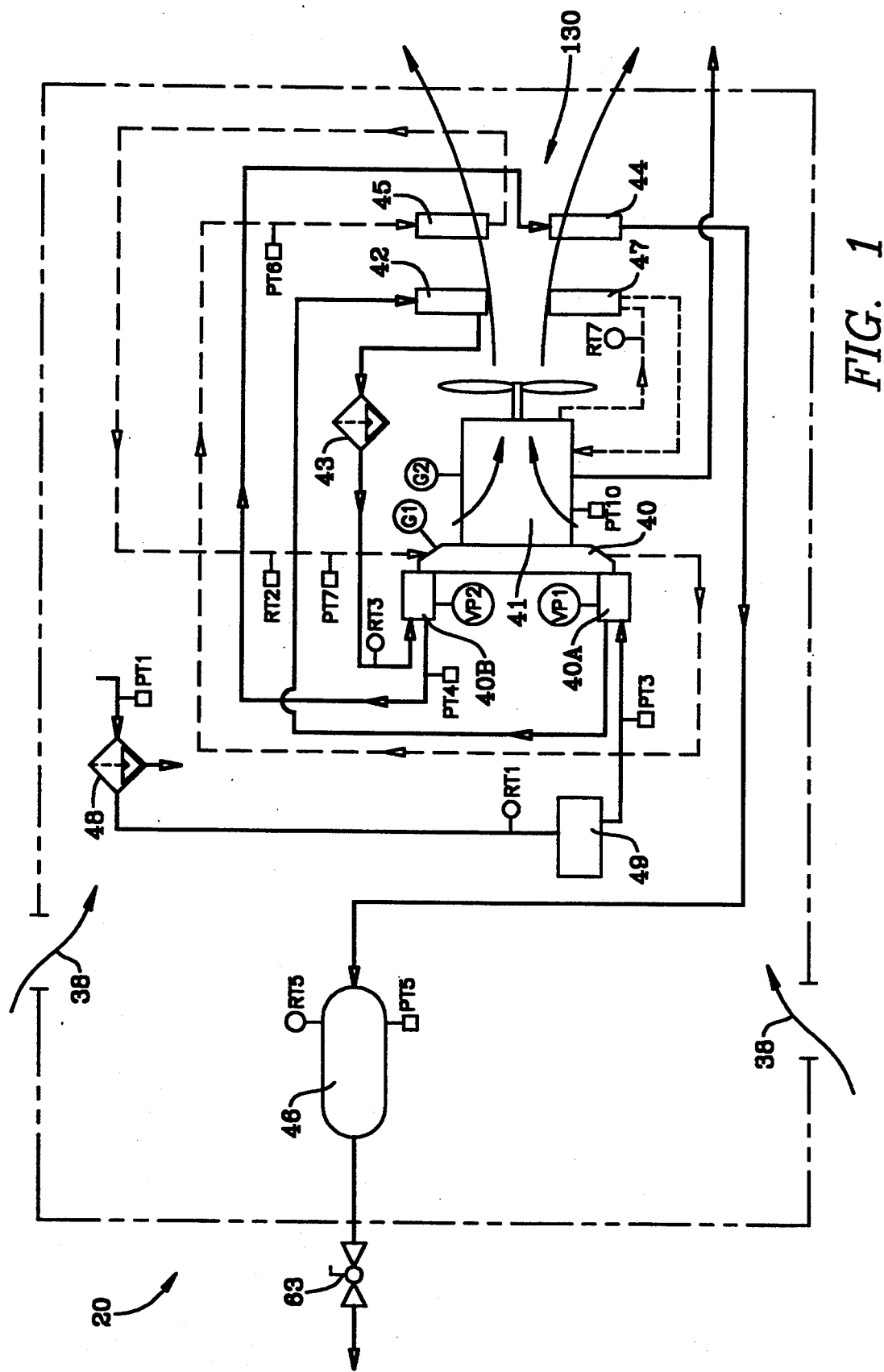

FIG. 1 is a functional schematic of a portable, electronically controlled centrifugal compressor 20 having the following major system components: a two stage centrifugal compressor or airend 40, having a first stage 40A and a second stage 40B; a prime mover 41, such as a diesel engine; an intercooler 42; a water separator 43; an aftercooler 44; an oil cooler 45; a receiver tank 46; and an engine radiator 47. These major system components will be described in further detail hereinafter. Although an electronically controlled, portable centrifugal compressor is described herein, it is anticipated that the teachings of the present invention apply equally to any type of electronically controlled portable machine, as well.

Airend intake air is drawn through a pair of air intakes 38 and through two intake filters 48. The filtered intake air then flows through an inlet duct (not shown) to an inlet control valve 49. The compressor 20 includes instrumentation fluidly disposed in the intake air path upstream of the first stage of the airend. This instrumentation includes the following sensors: a pressure sensor PT1 which senses ambient barometric pressure; a temperature sensor RT1 which senses stage 1 inlet temperature; and a pressure sensor PT3 which senses stage 1 inlet vacuum.

Air entering the first stage 40A of the airend 40 is compressed to an intermediate predetermined pressure of approximately 35 PSIG. The air exits the first stage and flows through an interstage duct (not shown) to the intercooler 42 for cooling prior to entering stage two for final compression. Cooled and, usually, saturated interstage air leaves the intercooler 42 and flows through the water separator 43. Interstage air then flows from the water separator 43 to the airend 40 for second stage compression. Instrumentation present within the interstage air path includes a temperature sensor RT3 which measures second stage inlet temperature.

Interstage air is compressed by the second stage 40B to a pressure equal to 3-4 PSI above receiver tank pressure. The second stage compressed air exits the second stage 40B and flows through the afterstage discharge duct (not shown) to the aftercooler 44 for final cooling. Cooled and saturated second stage compressed air then flows from the aftercooler to the receiver tank 46. Compressed air is discharged out of the compressed air system through a service valve 63. Instrumentation which is present within the afterstage air path includes a pressure sensor PT4 which senses stage 2 outlet pressure, a pressure sensor PT5 which senses receiver tank pressure, and a temperature sensor RT5 which senses receiver tank temperature.

Figure 2:
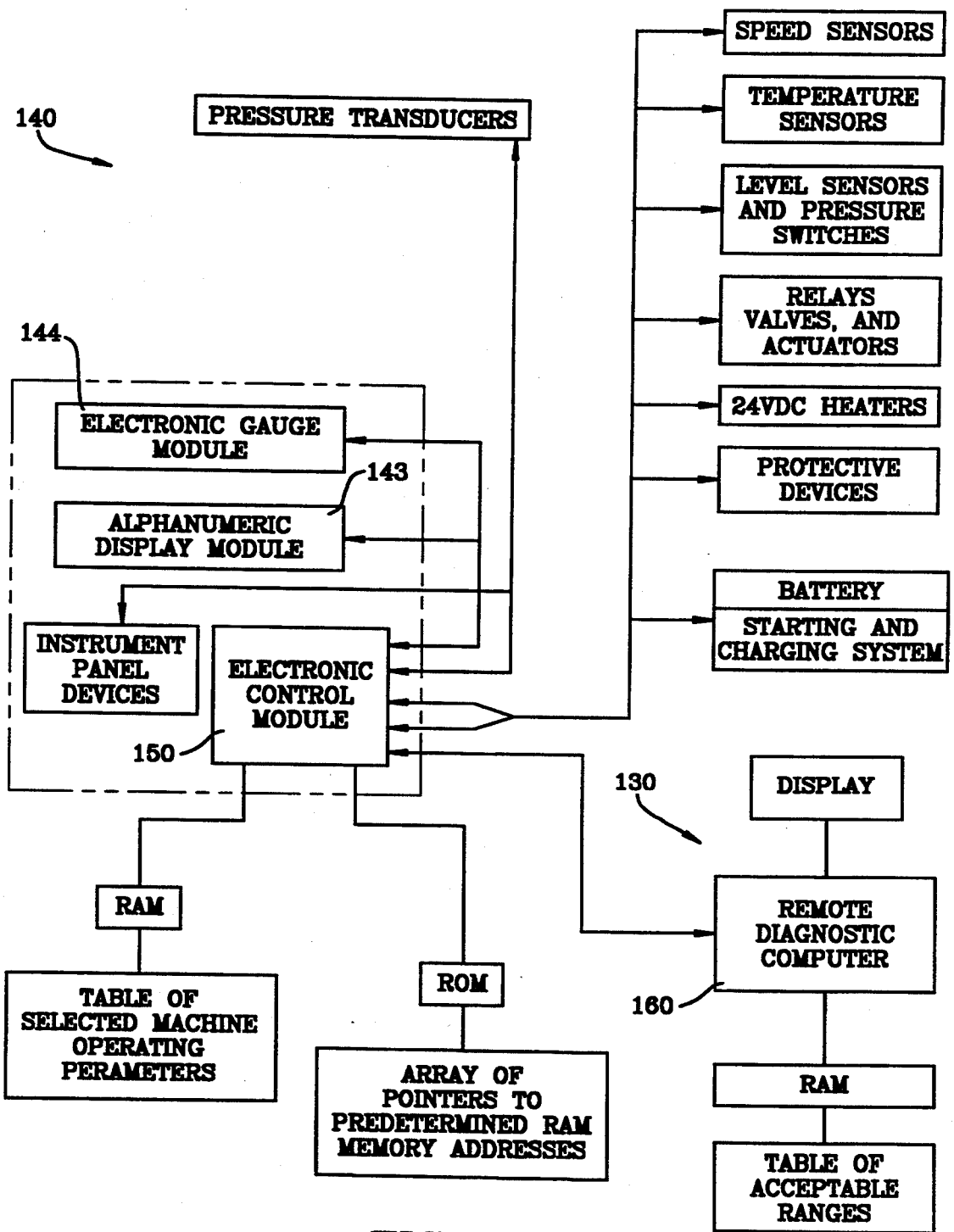

FIG. 2 provides a functional block diagram of a computerized diagnostic system 130 and a compressor electronic control system 140 which includes a microprocessor-based electronic controller 150 which provides complete control of the compressor 20, and which has a RAM type memory and a ROM type memory. The computerized diagnostic system 130 includes a remote, diagnostic computer 160, having a means for displaying user friendly symbols, a RAM type memory and a ROM type memory.

Within the electronic control system 140, a plurality of sensors are used to provide the electronic controller 150 with pressure measurements at predetermined fluid locations in the compressor 20, namely, PT1 (barometric pressure), PT3 (stage 1 inlet vacuum), PT4 (stage 2 outlet pressure), PT5 (receiver tank pressure), PT6 (oil cooler inlet pressure), PT7 (airend oil supply pressure), and PT10 (engine oil pressure). With the exception of the engine oil pressure sensor PT10, which is a resistance sender type sensor, all other pressure sensors are 50 millivolt pressure transducers. A plurality of sensors also provide the electronic controller 150 with temperature measurements at predetermined fluid locations in the compressor 20, namely, RT1 (stage 1 inlet temperature), RT2 (airend oil supply temperature), RT3 (stage 2 inlet temperature), RT5 (receiver tank temperature), RT6 (airend oil sump temperature), and RT7 (engine coolant temperature). All temperature sensors are 100 ohm resistance temperature detectors. Additionally, two identical speed sensors, G1 and G2, are used to provide the electronic controller 150 with speed inputs. The speed sensors are of the magnetic pickup type and generate an alternating voltage signal with a frequency proportional to the rate at which gear teeth pass the pickup. The primary speed sensor, G1, measures compressor bull gear speed. The secondary speed sensor, G2, measures engine flywheel gear speed. Two proximity type vibration sensors, VP1 and VP2, are used to measure airend vibrations of the high-speed airend pinions (not shown). Each vibration sensor is connected to a respective vibration transmitter module (not shown) which converts the raw vibration signal to a 4–20 milliamp signal that is linear with vibration. The 4–20 milliamp signal from each vibration transmitter is connected to the electronic controller 150 for analysis. All raw data inputs provided by the sensors are stored in the RAM of the electronic controller 150.

The electronic control system 140 includes an alphanumeric display module 143 and an electronic gauge module 144. The alphanumeric display module 143 includes a message display and a digital display. The message display is a two line by sixteen character display which provides a user with diagnostic information, operational status messages, and the name of a measured parameter being displayed in the digital display. The digital display provides a numeral which corresponds to a displayed operational status message. The message display provides machine operational status messages to a user, enables a user to monitor compressor operating parameters, displays diagnostic messages indicating when service is needed to an element of the compressor, displays causes of automatic shutdowns, permits a user to program certain operational features, and permits a user to perform certain service and troubleshooting techniques.

The electronic gauge module 144 includes a plurality of lighted liquid crystal display (LCD) bar graph units which may display such information as the amount of fuel in tanks, engine oil pressure, engine coolant temperature, and service air temperature.

The operation of the compressor 20 is defined by a unique set of operating parameters which are useful in the diagnosis and monitoring of the compressor. This unique set of operating parameters is a subset of the set of operating parameters which is provided by the sensors to the compressor. More particularly, the set of operating parameters of the compressor 20 may include such parameters as barometric pressure (PT1), stage 1 inlet vacuum (PT3), stage 2 outlet pressure (PT4), receiver tank pressure (PT5), oil cooler inlet pressure (PT6), airend oil supply pressure (PT7), engine oil pressure (PT10), stage 1 inlet temperature (RT1), airend oil supply temperature (RT2), stage 2 inlet temperature (RT3), receiver tank temperature (RT5), airend oil sump temperature (RT6), engine coolant temperature (RT7), compressor bull gear speed (G1), engine flywheel gear speed (G2), and airend vibrations VP1 and VP2. The unique set is comprised of those operating parameters which are useful in the diagnosis and monitoring of the compressor 20. For purpose of example only, the unique set may include stage 1 inlet vacuum (PT3), stage 2 outlet pressure (PT4), inlet temperature (RT3), engine coolant temperature (RT7), and compressor bull gear speed (G1). A novel aspect of the computerized diagnostic system 130 is the inclusion of an array of pointers which is stored in the ROM of the electronic controller 150 and which facilitate the location of the specific predetermined RAM addresses which correlate to the unique set of raw machine operating parameters known to be useful in the monitoring and diagnosis of the compressor 20. The remote diagnostic computer 160 has stored in a RAM, a table of reference values and ranges to which the unique set of machine operating parameters are compared.

In operation, the electronic controller completely controls operation of the compressor 20. The electronic sensors provide the controller 150 with continuous data relating to the raw operating parameters of the compressor 20. At predetermined time intervals, the sensors are polled for the raw machine operating parameters, which are then stored in the RAM of the electronic controller. The array of pointers then locates the predetermined RAM addresses which correlate to raw, predetermined machine operating parameters which are known to be useful in the monitoring and diagnosis of the compressor 20. These predetermined machine operating parameters are then stored in the RAM of the electronic controller 150 as a table of selected machine operating parameters.

To diagnose and monitor the compressor 20, electronic communication is established between the electronic controller and the remote diagnostic computer. Thereafter, the table of selected machine operating parameters is retrieved into the RAM of the remote diagnostic computer in a predetermined, time stamped order to facilitate identification thereof. At this time the retrieved data is interpreted by comparing these parameters to the table of reference parameters. The raw machine operating parameters are then converted into user friendly symbols, such as alphabet figures of a predetermined language, icons, or numerals. The user friendly symbols are displayed on a suitable display means, such as a CRT, in function-specific groupings which reveal patterns of machine operation and which identify the process which the machine is performing. For example, the temperature data of the compressor 20 is displayed in order of the reverse flow of the compressed fluid through the compressor 20. In this manner, diagnostic output may be quickly scanned as a logical sequence by a user to provide a complete, comprehensible "snap shot" of the operating parameters of the compressor 20 which may reveal machine operating patterns which may suggest normal or abnormal compressor operation. In this manner, the compressor 20 is diagnosed and monitored.

While this invention has been illustrated and described in accordance with a preferred embodiment, it is recognized that variations and changes may be made therein without departing from the invention as set forth in the following claims.

Having described the invention, what is claimed is:

1. A computerized diagnostic system for providing diagnostic output relating to a predetermined machine, the computerized diagnostic system comprising:
   a portable machine having unique operating characteristics;
   a microprocessor-based electronic control means for controlling the portable machine, the electronic control means having a RAM type memory and a ROM type memory;
   means for electronically providing raw, operating parameters of the portable machine to the electronic control means;
   means for storing, in the RAM of the electronic control means, the raw operating parameters of the portable machine;
   an array of pointers for facilitating the location of predetermined RAM addresses of raw machine operating parameters, the predetermined RAM addresses correlating to a unique set of raw machine operating parameters which are known to be useful in the monitoring and diagnosis of the portable machine;
   a remote, microprocessor-based computer means for diagnosing and monitoring the electronically controlled machine;
   means for establishing communication between the electronic control means and the remote computer means;
   reference means, stored in a memory of the remote computer means, for interpreting the raw, predetermined machine operating parameters known to be useful in the monitoring and diagnosis of the machine;
   means for retrieving, into the memory of the remote computer means, the raw, predetermined machine operating parameters in a predetermined, time stamped order to facilitate identification thereof; and
   means for displaying user friendly symbols, which correlate to the raw machine operating parameters, in function-specific groupings which permit the predetermined diagnostic output to be displayed in a machine operational sequence to reveal a complete and comprehensible snapshot of the machine operating parameters permitting the determination of normal and abnormal machine operation.

2. A computerized diagnostic system, as claimed in claim 1, and wherein the portable machine is a compressor.

3. A method for providing diagnostic output relating to a machine, the method comprising the following steps:
   controlling operation of a predetermined portable machine, having unique operating characteristics, using an electronic controller having a ROM type memory and a RAM type memory;
   electronically sensing raw machine operating parameters;
   at predetermined time intervals, providing the raw machine operating parameters to the electronic controller;
   storing, in the RAM of the electronic controller, the raw machine operating parameters;
   creating, in the ROM of the electronic controller, an array of pointers to predetermined addresses in the RAM of the electronic controller;
   locating, in the RAM of the electronic controller, using the array of pointers, the predetermined RAM addresses which correlate to raw, predetermined machine operating parameters which are known to be useful in the monitoring and diagnosis of the unique, predetermined portable machine;
   creating a table of reference machine operating parameters in a remote diagnostic computer;
   establishing electronic communication between the electronic controller and the remote diagnostic computer;
   retrieving, into a memory of the remote diagnostic computer and in a predetermined, time stamped order to facilitate identification thereof, the located, predetermined, raw, machine operating parameters;
   interpreting the retrieved, predetermined machine operating parameters by comparing these parameters to the table of reference parameters;
   converting the predetermined, raw machine operating parameters into user friendly symbols; and
   displaying the user friendly symbols in function-specific groupings which permit the predetermined diagnostic output to be displayed in a machine operational sequence to reveal a complete and comprehensible snapshot of the machine operating parameters permitting the determination of normal and abnormal machine operation.

* * * * *